(12) United States Patent
Wood

(10) Patent No.: US 7,108,753 B2
(45) Date of Patent: Sep. 19, 2006

(54) STAGGERED RIBS ON PROCESS CHAMBER TO REDUCE THERMAL EFFECTS

(75) Inventor: Eric R. Wood, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 282 days.

(21) Appl. No.: 10/696,481

(22) Filed: Oct. 29, 2003

(65) Prior Publication Data

US 2005/0092242 A1 May 5, 2005

(51) Int. Cl.
C23C 16/46 (2006.01)
C23C 16/458 (2006.01)
H01L 21/306 (2006.01)

(52) U.S. Cl. ............. 118/715; 118/724; 118/725; 118/730; 156/345.27; 156/345.52; 156/345.55

(58) Field of Classification Search ............... 118/715, 118/724, 725, 730; 156/345.27, 345.52, 156/345.55
See application file for complete search history.

(56) References Cited

U.S. PATENT DOCUMENTS

| | | | |
|---|---|---|---|
| 4,654,509 A | 3/1987 | Robinson et al. | |
| 4,836,138 A | 6/1989 | Robinson et al. | |
| 4,920,918 A | 5/1990 | Adams et al. | |
| 5,194,401 A * | 3/1993 | Adams et al. | 438/765 |
| 6,093,252 A | 7/2000 | Wengert et al. | |
| 6,132,553 A * | 10/2000 | Ikeda et al. | 156/345.1 |
| 6,465,761 B1 | 10/2002 | Stevens et al. | |
| 6,608,287 B1 * | 8/2003 | Halpin et al. | 219/390 |
| 2005/0092242 A1 * | 5/2005 | Wood | 118/715 |
| 2005/0109275 A1 * | 5/2005 | Wood | 118/715 |

OTHER PUBLICATIONS

Benchmark, "The ASM—Epitaxy Newsletter of Continuous Improvement", Fall 1999.

* cited by examiner

*Primary Examiner*—Jeffrie R. Lund
(74) *Attorney, Agent, or Firm*—Knobbe Martens Olson & Bear LLP

(57) ABSTRACT

A semiconductor processing chamber having a plurality of ribs on an exterior surface of the chamber is provided. The ribs are positioned relative to the chamber such that shadows cast into the chamber by the ribs are offset from one another, thus more uniformly distributing radiant energy entering the chamber. In one embodiment, the ribs are positioned on the exterior surface of the chamber so that they have dissimilar radial distances from a center of the chamber. When a substrate rotates within the chamber, shadows produced by the ribs on a first side of the chamber fall substantially between secondary shadows produced by the ribs on a second side of the chamber. Likewise, shadows produced by the ribs on the second side of the chamber fall substantially between the secondary shadows produced by the ribs on the first side of the chamber.

27 Claims, 5 Drawing Sheets

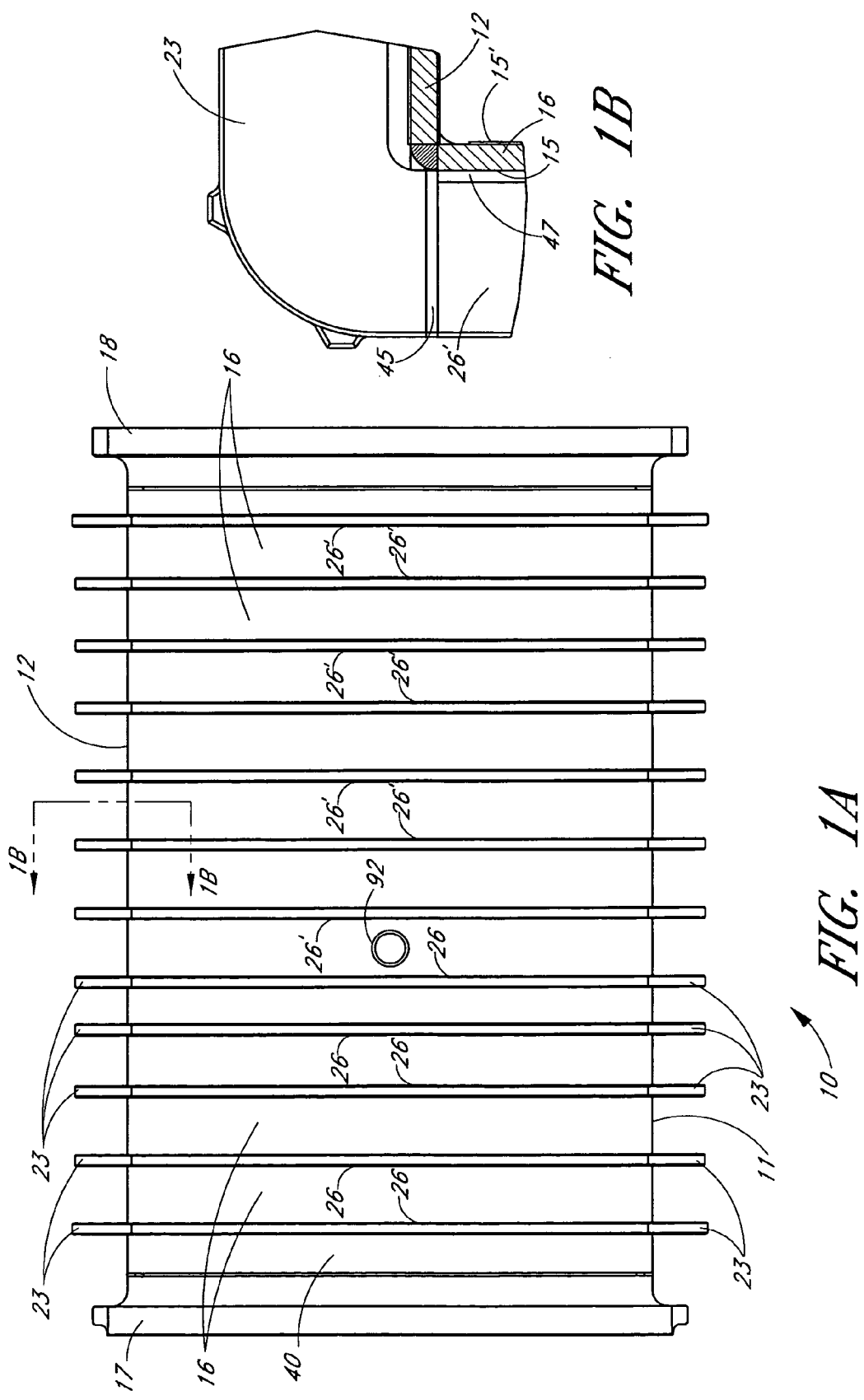

STAGGERED RIBS ON PROCESS CHAMBER TO REDUCE THERMAL EFFECTS

BACKGROUND OF THE INVENTION

1. Field of the Invention

This invention relates generally to semiconductor processing chambers, and relates more particularly in one embodiment to the positioning of ribs on exterior surfaces of a process chamber to reduce thermal effects within the process chamber.

2. Description of the Related Art

Process chambers for thermally processing semiconductor wafers typically are made of quartz (vitreous silica) or similar material because quartz is substantially transparent to radiant energy. Radiant heaters may be positioned adjacent the exterior of the chamber, and a wafer being processed in the chamber can be heated to elevated temperatures without having the chamber walls heated to the same level. Furthermore, quartz is desirable because it can withstand very high temperatures, and its inert characteristics enable it to withstand degradation by various processing gases.

For applications in which the pressure within a quartz chamber is to be reduced much lower than the surrounding ambient pressure, cylindrical or spherical chambers often are preferred from a strength standpoint because their curved surfaces can best withstand the inwardly directed force. However, when positioning a flat wafer for chemical vapor deposition purposes where the deposition gases flow parallel to the wafer, it is desirable that the chamber wall be parallel to the facing flat surface of the wafer, to obtain uniform deposition on the wafer surface. Uniform deposition is critical to obtain a high yield of acceptable products to be made from such wafer. However, a flat wall will collapse inwardly with reduced interior pressure sooner than will an outwardly convex wall of similar size and thickness.

To handle the inwardly directed forces on flat wall chambers, gussets or ribs have been provided on the exterior of the walls extending generally perpendicular to the wall to which they are joined, as may be seen in U.S. Pat. No. 4,920,918, issued on May 1, 1990, titled PRESSURE-RESISTANT THERMAL REACTOR SYSTEM FOR SEMICONDUCTOR PROCESSING, all of which is hereby incorporated by reference and made a part of this specification. One disadvantage of such a design is that even though quartz is substantially transparent to the radiant lamp energy, the ribs sections present a region of much thicker quartz, and thus the ribs locally absorb more lamp energy and attenuate the lamp energy delivered to the wafer. This attenuation of energy causes cooler regions (i.e., shadows) on the wafer. Such non-uniformity of temperature on the wafer surface reduces the quality of the films that may be grown thereon, particularly for process conditions that are temperature-sensitive.

Temperature non-uniformities typically may be somewhat reduced by rotating the wafer during processing. Rotation causes regions of the wafer that would otherwise reside within shadows all of the time to pass into warmer regions, as well. Thus, rotation tends to distribute temperatures of the wafer surface somewhat more uniformly. It has been found, however, that if the ribs positioned forward of the wafer center (i.e., the axis of rotation of the wafer) are located at approximately the same distance from the wafer center as are the ribs positioned rearward of the wafer center, temperature uniformity suffers even with rotation. Specifically, forward and rearward ribs positioned at relatively similar distances from the wafer center cause a combined shadowing effect on the surface of the rotating wafer which can result in temperature distributions that are more non-uniform than can otherwise be achieved.

SUMMARY OF THE INVENTION

A semiconductor processing chamber having a plurality of ribs on an exterior surface of the chamber is provided. The ribs are positioned relative to the chamber such that shadows cast into the chamber by the ribs are offset from one another, thus more uniformly distributing radiant energy to the rotating wafer. In one embodiment, the ribs are positioned on the exterior surface of the chamber so that they have dissimilar radial distances from a center of the chamber. This causes shadows produced by the ribs on a first side of the chamber to fall substantially between those shadows produced by the ribs on a second side of the chamber. Likewise, shadows produced by the ribs on the second side of the chamber fall substantially between the shadows produced by the ribs on the first side of the chamber.

In one embodiment, a chamber is provided. The chamber comprises a chamber upper wall and a chamber lower wall. Each wall has an inner surface and an outer surface and defines an interior space therebetween. A plurality of forward ribs is provided on the outer surface of at least one of the chamber upper wall and chamber lower wall in a forward portion of the interior space. The forward portion is defined as forward of a central axis of the chamber. A plurality of rearward ribs is provided on the outer surface of at least one of the chamber upper wall and chamber lower wall in a rearward portion of the interior space. The rearward portion is defined as rearward of the central axis of the chamber. At least some of the forward ribs are positioned to have mirrored projections in the rearward portion of the chamber falling substantially between adjacent rearward ribs, and at least some of the rearward ribs are positioned to have mirrored projections in the forward portion of the chamber falling substantially between adjacent forward ribs.

In another embodiment, a reaction chamber is provided. The reaction chamber comprises a chamber upper wall and a chamber lower wall. Each wall has an inner surface and an outer surface and defining a reaction space therebetween. An inlet flange is secured at a forward end of the chamber to the upper and lower walls. An outlet flange is secured at a rearward end of the chamber to the upper and lower walls. A substrate support is provided within the chamber space. The substrate support has a central axis around which the substrate support rotates. A radiant heat source is provided above the chamber, and a radiant heat source is provided below the chamber. A plurality of forward ribs are provided on the outer surface of the chamber upper wall and chamber lower wall. The forward ribs are located between the central axis of the substrate support and the inlet flange, wherein the forward ribs form a shadow onto the substrate support in a forward portion of the reaction space. A plurality of rearward ribs are provided on the outer surface of the chamber upper wall and chamber lower wall. The rearward ribs are located between the central axis of the substrate support and the outlet flange, wherein the rearward ribs form a shadow onto the substrate support in a rearward portion of the reaction space. A majority of the shadows formed by the forward ribs have a mirrored projection in the rearward portion of the reaction space that falls substantially between shadows of the rearward ribs. Likewise, a majority of the shadows formed by the rearward ribs have a mirrored projection in the forward portion of the reaction space that falls substantially between shadows of the forward ribs.

In still another embodiment, a reaction chamber is provided. The reaction chamber comprises a chamber upper wall and a chamber lower wall. Each wall has an inner surface and an outer surface and defines a reaction space therebetween. A substrate support is provided within the reaction space. The substrate support has a central axis around which the substrate support rotates. A plurality of forward ribs is provided on the outer surface of at least one of the chamber upper wall and chamber lower wall in a forward portion of the reaction space. A plurality of rearward ribs is provided on the outer surface of at least one of the chamber upper wall and chamber lower wall in a rearward portion of the reaction space. At least some of the forward ribs have a mirrored projection in the rearward portion of the reaction space that are approximately equidistant from adjacent rearward ribs. Likewise, at least some of the rearward ribs have a mirrored projection in the forward portion of the reaction space that are approximately equidistant from the adjacent forward ribs.

BRIEF DESCRIPTION OF THE DRAWINGS

FIG. 1A is a bottom elevation view of the processing chamber of FIG. 1.

FIG. 1B is a partial cross-section view of the processing chamber of FIG. 1, taken along line 1B—1B.

DETAILED DESCRIPTION OF THE PREFERRED EMBODIMENTS

Although certain preferred embodiments and examples are disclosed below, it will be understood by those skilled in the art that the invention extends beyond the specifically disclosed embodiments to other alternative embodiments and/or uses of the invention and obvious modifications and equivalents thereof. Thus, it is intended that the scope of the invention herein disclosed should not be limited by the particular disclosed embodiments described below.

Figure 1:
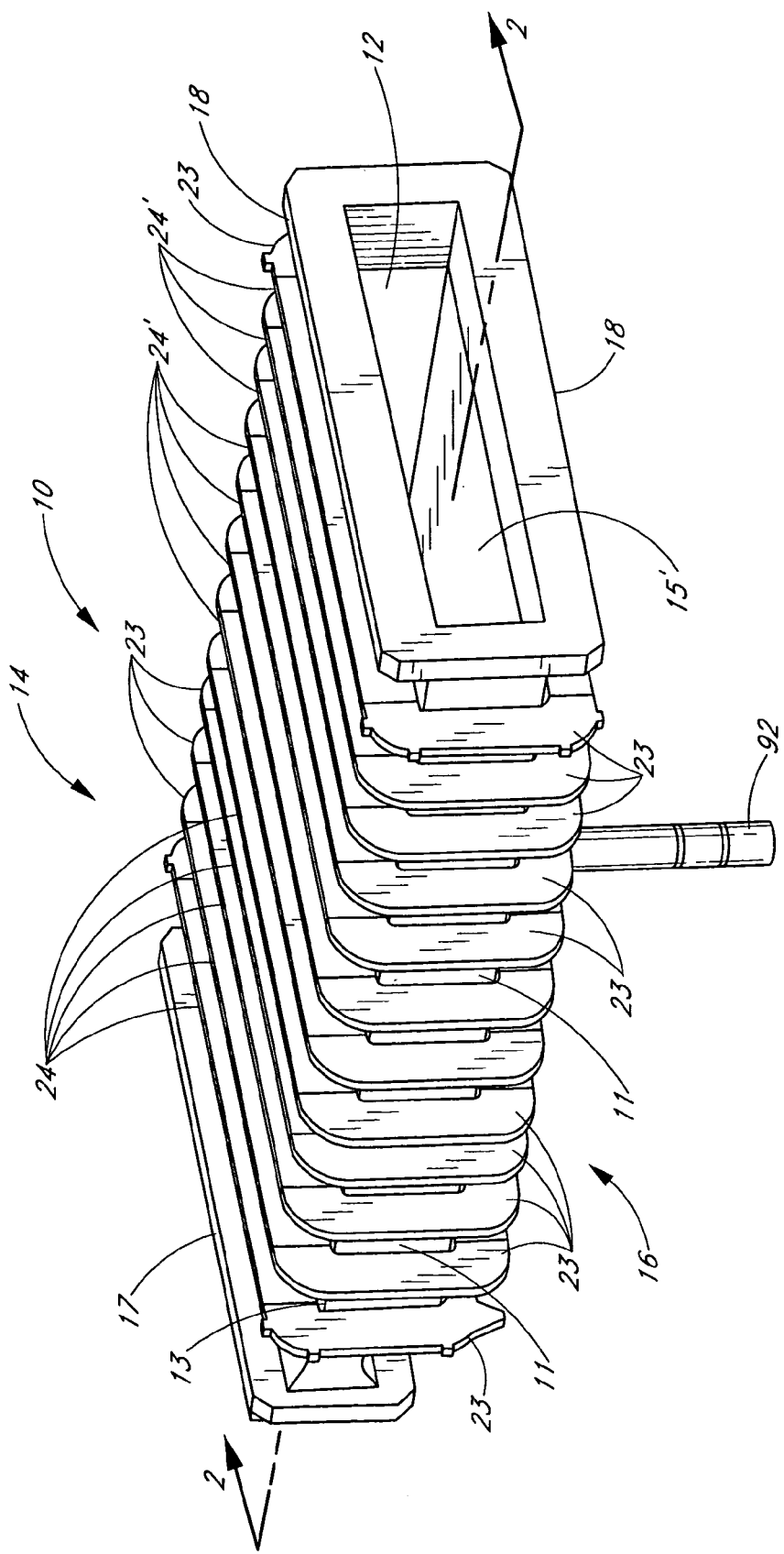
FIG. 1 is a perspective view of a semiconductor processing chamber having a plurality of ribs on exterior surfaces of the chamber.
Figure 2:
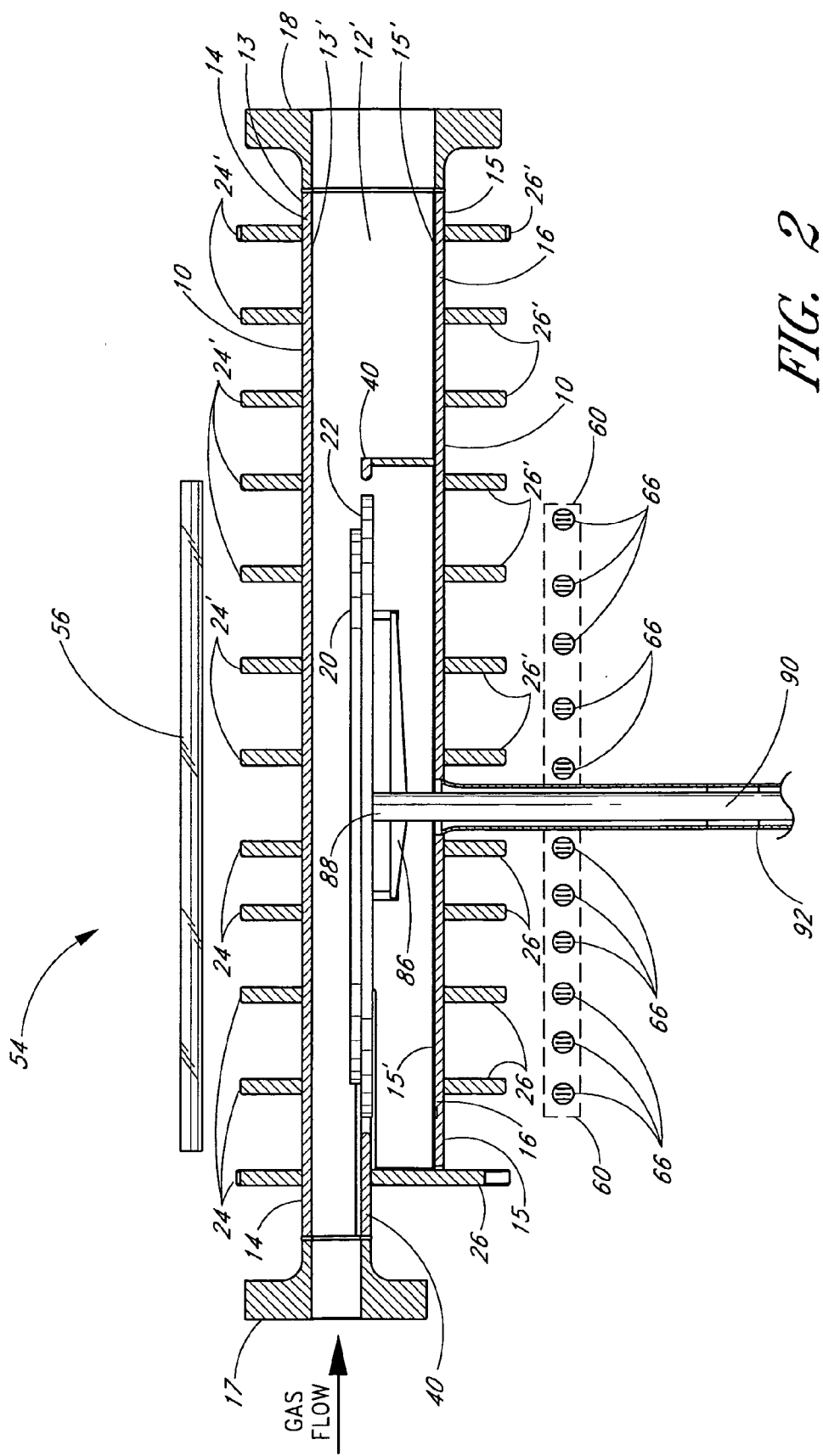
FIG. 2 is a cross-sectional view of the semiconductor processing chamber of FIG. 1, taken along line 2—2.

FIGS. 1–1B illustrate one embodiment of a reactor vessel or chamber 10 for chemical vapor processing. As can be seen, the chamber 10 has an elongated, generally flattened configuration. As best illustrated in FIG. 2, the chamber 10 has an upper wall 14 with an outer surface 13 and an inner surface 13', and a lower wall 16 with an outer surface 15 and an inner surface 15'. The walls 14, 16 are connected by vertically short side walls 11 and 12. The walls 11, 12, 14, 16 are joined by an upstream inlet flange 17 and a downstream outlet flange 18. Upstream and downstream relate to the direction of process gas flow through the chamber 10 and are synonymous in the present description with front and rear, as well as with frontward and rearward.

Alternatively, the chamber 10 can have configurations other than the flattened configuration shown in FIGS. 1–1B. For example, the chamber 10 can have tent-shaped cross-sectional shape, wherein the upper wall 14 and/or the lower wall 16 has a peak. In another embodiment, the upper/lower walls 14, 16 can be rounded, giving the chamber 10 a generally ovoid cross-sectional shape. It will be appreciated that in other embodiments, the upper/lower walls 14, 16 of the chamber 10 can be formed having other shapes in addition to the shapes discussed above, as well as combinations thereof.

The chamber height is less than the chamber width. In this respect, a longitudinal direction for the chamber 10 extends from the inlet flange 17 to the outlet flange 18, or along the section line 2—2. A lateral direction extends between the side walls 11, 12, or transversely to section line 2—2. The height direction is perpendicular to both the longitudinal and lateral axes. In one embodiment, the chamber 10 has a length of about 300 mm, a width of about 206 mm, and a height of about 66.7 mm. The chamber 10 is designed for processing a substrate such as a single crystal silicon wafer 20 illustrated in FIG. 2. It will be understood, however, that the advantages of this embodiment are equally applicable to batch wafer processing furnaces, whether for deposition, etching, anneal, dopant diffusion, photolithographic, or other processes for which elevated temperatures are desired. Additionally, substrates may comprise different materials, such as glass.

The wafer 20 is supported within the chamber 10 in any suitable fashion. For example, the illustrated wafer 20 is supported by a susceptor 22. The susceptor 22 preferably comprises a material opaque to radiant heat energy, such as graphite or silicon carbide, as is known in the art of semiconductor processing equipment. The susceptor 22 and wafer 20 combination are held at a desired height within the reaction chamber 10 by a support structure, as shown in FIG. 2. The susceptor 22 is supported on arms 86 of a suitable support 88 connected to the upper end of a rotatable shaft 90 that extends through a tube 92 depending from the bottom wall of the chamber 10. The susceptor 22 is shown approximately level with the upper surface of a support plate 40. This facilitates positioning the wafer 20 atop the susceptor 22 of the process chamber 10. Further details regarding interior chamber support assemblies, and other details about a semiconductor process chamber, can be found in U.S. Pat. No. 6,093,252, issued on Jul. 25, 2000, titled PROCESS CHAMBER WITH INNER SUPPORT, the entirety of which is hereby incorporated by reference and made a part of this specification.

An upper heating array 54 is mounted above the chamber 10. A plurality of radiant heating elements or lamps 56 are mounted within the upper heating array 54. Desirably, the heating lamps 56 are of an elongated tube type, disposed in spaced-apart parallel relationship and also substantially parallel with the reactant gas flow path through the underlying reaction chamber 10. Likewise, a lower heating array 60 is mounted below the chamber 10. The lower heating array 60 is similar in configuration to the upper heating array 54. A plurality of radiant heating elements or lamps 66 are housed within the lower heating array 60. Desirably, however, the lower heating lamps 66 comprise elongated tubes arranged transverse to the gas flow path, and accordingly transverse to the heating lamps within the upper heating array 54. The lower heating array 60 can also include separate concentrator lamps (not shown) to compensate for a cold spot created near/within the center of the wafer 20 by the tube 92 and the rotatable shaft 90 supporting the susceptor 22.

The lamps 56, 66 are preferably of similar configuration. Each of the elongated tube type heating elements 56, 66 is preferably a high intensity tungsten filament lamp having a transparent quartz envelope containing a halogen gas, such as iodine. The lamps produce radiant heat energy in the form of full-spectrum light, transmitted through the reaction chamber walls 14, 16 without appreciable absorption. As is known in the art of semiconductor processing equipment, the power of the various lamps 56, 66 can be controlled independently or in grouped zones in response to temperature sensors arranged in proximity to the substrate 20.

The lamps 56, 66 are illustrated in FIG. 2, without showing a detailed supporting structure. One of skill in the art, however, will readily recognize a number of manners of mounting the lamps relative to the chamber walls 14, 16. Preferably, each lamp 56, 66 includes an integrally formed axially extending lug on each of its opposite ends and a suitable connection pin arrangement extending from each of the lugs for receiving connectors provided at the end of electrical conductors. Details regarding heating arrays, spacing between heating arrays and chamber walls, as well as techniques for mounting lamps relative to chamber walls can be found in the above-mentioned U.S. patent, titled PROCESS CHAMBER WITH INNER SUPPORT, incorporated by reference herein.

Both the upper wall 14 and the lower wall 16 comprise thin, flat plate-like elements having a rectangular shape. A plurality of ribs 24, 24' extend from the outer surface 13 of the upper wall 14, and a plurality of ribs 26, 26' extend from the outer surface 15 of the lower wall 16. All of the ribs 24, 24', 26, 26' are oriented lengthwise transversely to the section line 2—2 of FIG. 1. As shown most clearly in FIGS. 2–3, each of the ribs 24 may be positioned directly above and aligned with a corresponding one of the ribs 26. Likewise, each of the ribs 24' may be positioned directly above and aligned with a corresponding one of the ribs 26'. Thus, the ribs 24, 26 comprise pairs of upper and lower ribs, and the ribs 24', 26' comprise pairs of upper and lower ribs. In the embodiment illustrated in the FIGS. 1–4, twelve pairs of ribs are utilized with approximately eight pairs of ribs being provided above and below the susceptor 22. In other embodiments, however, greater or fewer pairs of ribs may be used depending on the desired level of structural integrity of the chamber 10. In still other embodiments, corresponding pairs of the upper ribs 24, 24' and the lower ribs 26, 26' may not be aligned with one another. Thus, the upper ribs 24, 24' and the lower ribs 26, 26' may advantageously be fused to the chamber 10 with different orientations, alignments and/or spacing between adjacent ribs depending on the desired level of structural integrity of the chamber 10.

As best shown in FIG. 1, each pair of the ribs 24, 26 is fused on opposite ends to a pair of side ribs 23 protruding from the vertical side walls 11, 12. Likewise, each pair of the ribs 24', 26' is fused on opposite ends to a pair of the side ribs 23. Thus, coupling the side ribs 23 with the pairs of the ribs 24, 26 and 24', 26' forms continuous ribs which extend all the way around the chamber 10. In other embodiments, however, the side ribs 23 may be omitted from the chamber 10, thereby leaving the upper ribs 24, 24' and the lower ribs 26, 26' independent of one another. Furthermore, the ribs 24, 24', 26, 26' each has a rectangular cross-sectional shape, as best shown in FIG. 2. It will be appreciated, however, that other cross-sectional shapes may be utilized, including, but not limited to, cross-sectional shapes being substantially square, circular, semi-circular, ovoid, triangular, as well as combinations of these, or other, cross-sectional shapes forming additional cross-sectionals shapes.

The walls 14, 16 and the ribs 24, 24', 26, 26' preferably are made of quartz or other similar material. In one embodiment, the walls 14, 16 have a thickness of between about 4 and about 6 millimeters, and more preferably the wall thickness is approximately 5 millimeters. Although quartz is preferred, other materials having similar desirable characteristics may be substituted. Some of these desirable characteristics include a high melting point, the ability to withstand large and rapid temperature changes, chemical inertness, and high transparency to light.

The ribs 24, 24', 26, 26' may be monolithic or formed from segments fused together at their ends, as discussed above. In one embodiment, the ribs 24, 24', 26, 26' are fused to the outer surfaces 13, 15 of the walls 14, 16, respectively. FIG. 1B shows one embodiment of a fusion 45 between one of the side ribs 23 and the corresponding rib 26'. Similarly, a fusion 47 is shown between the rib 26' and the outer surface 15 of the wall 16. The fusing procedure may comprise placing bits of quartz between the ribs and the surfaces 13, 15 and then using a torch or other local heat source, similar to a brazing procedure. A segmented rib may be fused together before or after being fused to the chamber 10. Preferably, thermal annealing is used at least once, and more preferably several times, during the fusion of the ribs to remove local stresses induced by the fusion procedure. In another embodiment, the ribs and the walls may be formed monolithically in a mold as part of a casting procedure. Further details regarding the formation and attachment of ribs to semiconductor processing chambers can be found in the above-mentioned U.S. patent, titled PRESSURE-RESISTANT THERMAL REACTOR SYSTEM FOR SEMICONDUCTOR PROCESSING, incorporated by reference herein.

Figure 3:
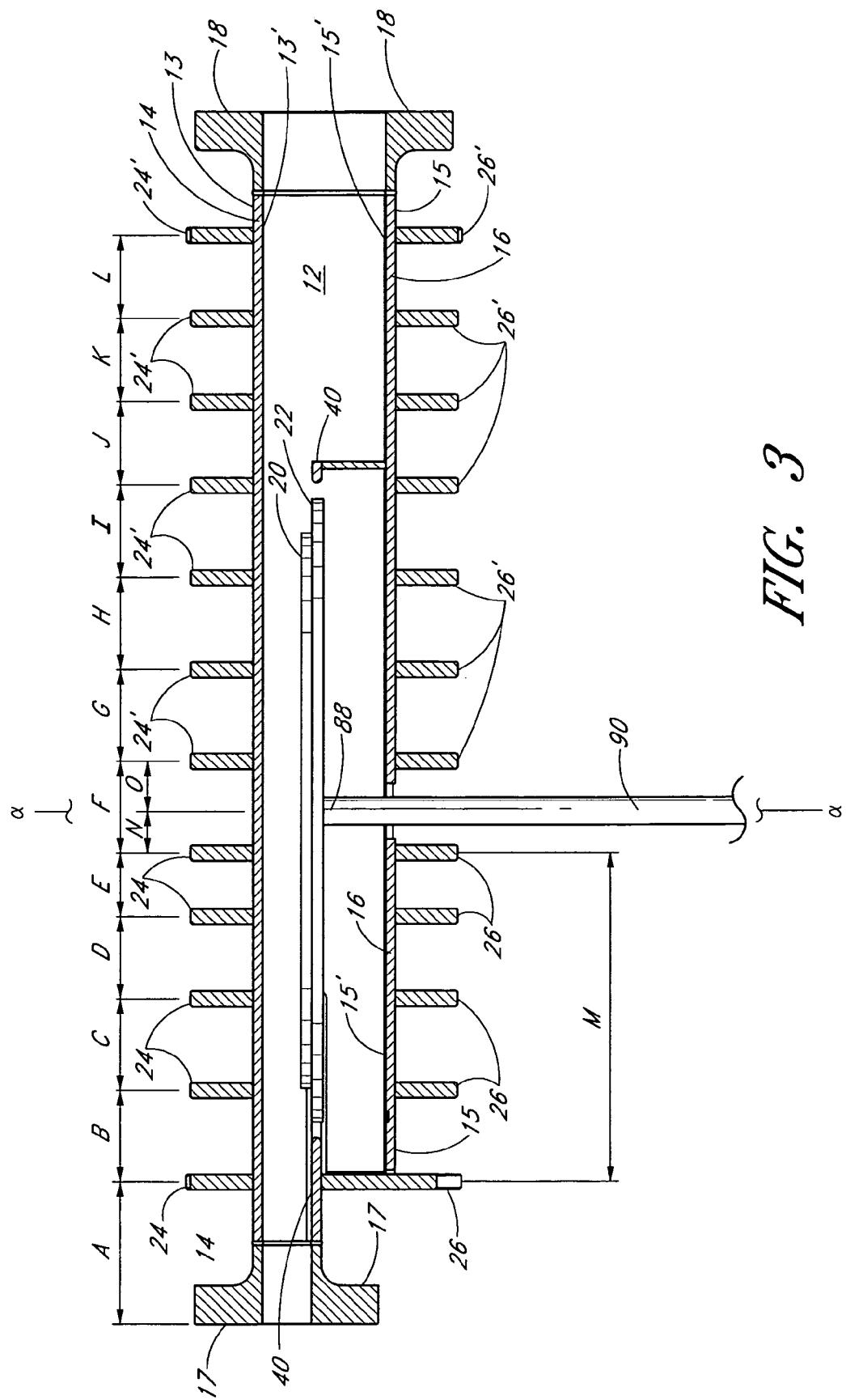
FIG. 3 is a schematic view of the semiconductor processing chamber of FIG. 2, illustrating the positions of the ribs relative to an axis of rotation of a susceptor and wafer within the chamber.

FIG. 3 illustrates the positions of the ribs 24, 24', 26, 26' relative to an axis of rotation α of the susceptor 22 and the wafer 20. The ribs 24, 26 are positioned between the inlet flange 17 and the axis of rotation α, and the ribs 24', 26' are positioned between the axis of rotation α and the outlet flange 18. In one embodiment, the ribs 24, 24', 26, 26' are positioned on the chamber with distances measured relative to the inlet flange 17. These distances are denoted by dimensions A–O in FIG. 3. The following Table lists one set of values of the dimensions A–O which has been found to uniformly distribute shadows of the ribs on the rotating susceptor 22 and wafer 20 of the chamber 10 having a length of about 300 mm. The shadows are discussed in greater detail below.

TABLE 1

| Dimension Illustrated in FIG. 3 | Spacing (cm) |
|---|---|
| A | 3.51 |
| B | 2.26 |
| C | 2.26 |
| D | 2.0308 |
| E | 1.5678 |
| F | 2.26 |
| G | 2.26 |
| H | 2.26 |
| I | 2.26 |
| J | 2.0514 |
| K | 2.05 |
| L | 2.05 |
| M | 8.1186 |
| N | 1.0314 |
| O | 1.2286 |

It will be appreciated that the values of the dimensions A–O, listed in the above Table 1, may be determined during designing of the process chamber 10. Preferably the dimensions A–O provide distances between the ribs that are as uniform as practicable to adequately support the processing chamber 10 while also uniformly distributing shadows of the ribs within the chamber 10. In one embodiment, the dimensions A–O may be determined, at least partially, based on stress analysis of the chamber 10.

For the sake of clarity, the ribs 24, 26 will be referred to as "forward ribs," and the ribs 24', 26' will be referred to as "rearward ribs." Moreover, the portion of the chamber 10 between the inlet flange 17 and the central axis α will be referred to as a "forward portion" of the chamber. Similarly, the portion of the chamber 10 between the central axis α and the outlet flange 18 will be referred to as a "rearward portion" of the chamber.

Figure 4:
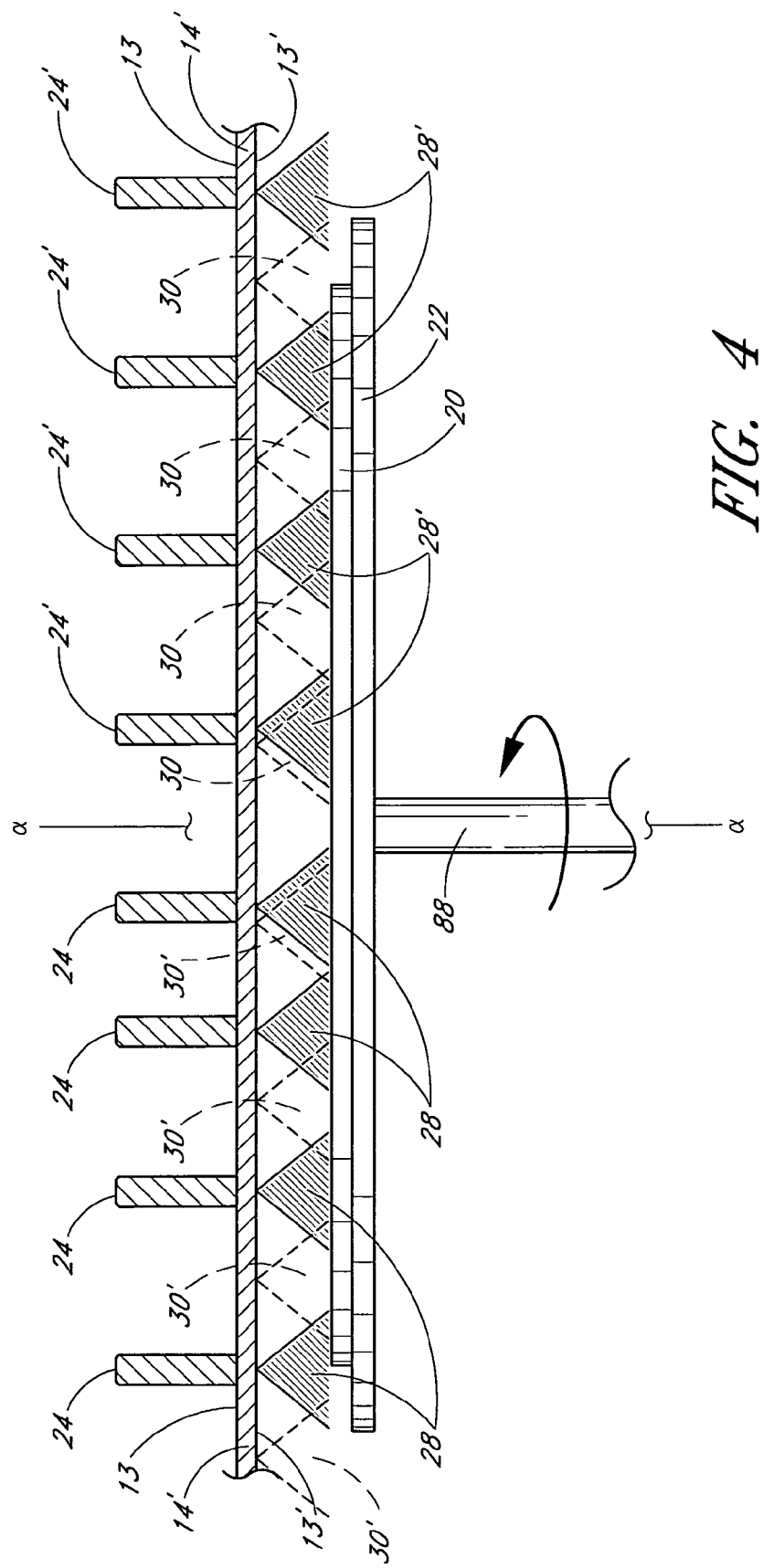
FIG. 4 is a schematic view illustrating shadows cast on the susceptor and wafer by several of the ribs on an upper surface of the chamber.

As shown in FIG. 2, the lamps 56 are mounted above the ribs 24, 24', and the lamps 66 are mounted below the ribs 26, 26'. It will be appreciated that when the lamps 56, 66 are illuminated, the ribs 24, 24', 26, 26' obstruct some of the radiant energy entering the chamber 10. Thus, when the lamps 56, 66 are illuminated the ribs 24, 24', 26, 26' cast shadows onto the susceptor 22 and wafer 20. As illustrated in FIG. 4, each of the forward ribs 24 forms a shadow 28 on the susceptor 22 and wafer 20 in a forward portion of the chamber 10. Similarly, each of the rearward ribs 24' forms a shadow 28' on the susceptor 22 and wafer 20 in a rearward portion of the chamber 10. Although not shown in FIG. 4, it should be noted that the ribs 26 may contribute to the shadows 28, and the ribs 26' may contribute to the shadows 28'. It has been found that when the susceptor 22 and wafer 20 are rotated, as indicated in FIG. 4, each of the forward ribs 24 forms a secondary shadow or mirrored projection 30 on the susceptor 22 and wafer 20 in the rearward portion of the chamber 10. It has been similarly found that when the susceptor 22 and wafer 20 are rotated, each of the rearward ribs 24' forms a mirror projection 30' in a forward portion of the chamber 10.

As shown in FIG. 4, each of the ribs 24 (26) above (or below) the wafer 20, with the exception of the projection 30 closest to the axis of rotation α, is positioned relative to the axis of rotation α such that each of the mirror projections 30 is positioned substantially between adjacent shadows 28'. Likewise, each of the ribs 24' (26') above (or below) the wafer 20, with the exception of the projection 30 closest to the axis of rotation α, is positioned relative to the axis of rotation α so the mirror projections 30' are positioned substantially between adjacent shadows 28. It will be appreciated, therefore, that the ribs 24 (26) are positioned at distances from the axis of rotation α which differ (or are "offset") from the distances of the ribs 24' (26') from the axis of rotation α. In one embodiment, the offset distances are formed by positioning the ribs 24, 24', 26, 26' according to the values listed in the Table given above. Because of these offset distances between the axis of rotation α and the ribs 24, 24', 26, 26', when the susceptor 22 and wafer 20 is rotated the radiant energy incident thereon is more uniformly distributed than is possible in absence of the offset distances.

As shown in FIG. 4, in one embodiment, whether the mirror projection of one rib falls substantially between adjacent shadows of ribs on the other side of the axis of rotation α can be determined if the center of the mirrored projection of each rib (except for the two ribs closest to the axis of rotation) is positioned approximately equidistant from the centers of the adjacent shadows of the opposing ribs. In one embodiment, a projection can be determined to be approximately equidistant from the centers of the adjacent shadows of the opposing ribs if it is no more than about 15% from the midpoint between the two opposing ribs, the percentage being based on the distance between the two opposing ribs. More preferably, the projection is no more than about 10% from the midpoint, and even more preferably no more than about 5% from the midpoint. For example, with reference to FIGS. 3 and 4, the second closest forward rib 24 to axis α is (N+E)–O from the rearward rib 24' closest to axis α, and (O+G)–(N+E) from the rearward rib 24' second closest to axis α. The midpoint between these two rearward ribs is calculated as (O+G/2). Thus, the projection of the second closest forward rib 24 is ((N+E)–O–(G/2))/G from the midpoint between the first and second closest rearward ribs 24'. Using the values given in FIG. 3 this value is about 11%.

In another embodiment, whether the mirrored projection of one rib falls substantially between adjacent shadows of ribs on the other side of the axis of rotation α can be determined if the mirrored projection of the rib overlaps both of the adjacent shadows of the opposing ribs. The size of the shadow can be determined by temperature differences, e.g., where temperature on the wafer 20 differs from the maximal temperature of the wafer 20 if no ribs are present. In one embodiment, the temperature difference on the wafer 20 due to the ribs in a shadowed portion preferably is more than about 0.85% less than the maximal temperature without the ribs, more preferably more than about 0.50%, still more preferably more than about 0.42%, still more preferably more than about 0.25%, and most preferably more than about 0.17%. In another embodiment, the temperature difference on the wafer 20 due to the ribs in a shadowed portion preferably is more than about 10° C. less than the maximal temperature without the ribs, more preferably more than about 5° C., still more preferably more than about 3° C., and most preferably more than about 2° C. In another embodiment, the mirrored projection need not overlap either of the adjacent shadows to be "substantially" between the two shadows. In yet another embodiment, a projection of a rib can be considered to be substantially between shadows of adjacent opposing ribs if the projection does not overlap either of the adjacent shadows by more than about 50%. It will be appreciated that not all of the ribs need to have mirrored projections that fall substantially between adjacent shadows of opposing ribs, and thus, in one embodiment, it will be sufficient if a majority or even just some of the ribs satisfy this criteria.

Although preferred embodiments of the invention have been described in detail, certain variations and modifications will be apparent to those skilled in the art, including embodiments that do not provide all of the features and benefits described herein. Accordingly, the scope of the invention is not to be limited by the illustrations or the foregoing descriptions thereof, but should be defined by reference to the appended claims.

What is claimed is:

1. A chamber, comprising:
   a chamber upper wall and a chamber lower wall, each wall having an inner surface and an outer surface and defining an interior space therebetween, said interior space having an inlet and outlet;
   a plurality of forward ribs provided on the outer surface of at least one of the chamber upper wall and chamber lower wall in a forward portion of the chamber, said forward portion being defined between the inlet and a central axis of rotation of a substrate support; and
   a plurality of rearward ribs provided on the outer surface of at least one of the chamber upper wall and chamber lower wall in a rearward portion of the chamber, said rearward portion being defined between the outlet and the central axis of rotation of the substrate support;

wherein at least some of the forward ribs are positioned to have mirrored projections in the rearward portion of the chamber falling substantially between adjacent rearward ribs, and at least some of the rearward ribs are positioned to have mirrored projections in the forward portion of the chamber falling substantially between adjacent forward ribs.

2. The chamber of claim 1, wherein the number of said ribs provided on the outer surface of the chamber upper wall is equal to the number of said ribs provided on the outer surface of the chamber lower wall.

3. The chamber of claim 2, wherein each of said ribs on the chamber upper wall is aligned with one of said ribs on the chamber lower wall.

4. The chamber of claim 1, further comprising an inlet flange secured at a forward end of said chamber to said chamber upper wall and said chamber lower wall.

5. The chamber of claim 1, further comprising an outlet flange secured at a rearward end of said chamber to said chamber upper wall and said chamber lower wall.

6. The chamber of claim 1, wherein a majority of the forward ribs are positioned to have mirrored projections in the rearward portion of the chamber falling substantially between adjacent rearward ribs, and a majority of the rearward ribs are positioned to have mirrored projections in the forward portion of the chamber falling substantially between adjacent forward ribs.

7. The chamber of claim 1, wherein each of said mirrored projections of the forward and rearward ribs is approximately equidistant from adjacent shadows.

8. The chamber of claim 7, wherein approximately equidistant comprises a mirrored projection being no more than about 15% of the distance between two opposing ribs from the midpoint between the two opposing ribs.

9. The reaction chamber of claim 7, wherein approximately equidistant comprises a mirrored projection being no more than about 10% of the distance between two opposing ribs from the midpoint between the two opposing ribs.

10. The reaction chamber of claim 7, wherein approximately equidistant comprises a mirrored projection being no more than about 5% of the distance between two opposing ribs from the midpoint between the two opposing ribs.

11. A reaction chamber, comprising:
a chamber upper wall and a chamber lower wall, each wall having an inner surface and an outer surface and defining a reaction space therebetween;
an inlet flange secured at a forward end of said chamber to said upper and lower walls;
an outlet flange secured at a rearward end of said chamber to said upper and lower walls;
a substrate support provided within the reaction space, the substrate support having a central axis around which the substrate support rotates;
a heat source provided above the chamber;
a heat source provided below the chamber;
a plurality of forward ribs provided on the outer surface of the chamber upper wall and chamber lower wall, said forward ribs being located between the central axis of the substrate support and the inlet flange, wherein said forward ribs form a shadow onto the substrate support in a forward portion of the reaction space; and
a plurality of rearward ribs provided on the outer surface of the chamber upper wall and chamber lower wall, said rearward ribs being located between the central axis of the substrate support and the outlet flange, wherein said rearward ribs form a shadow onto the substrate support in a rearward portion of the reaction space;

wherein a majority of the shadows formed by the forward ribs have a mirrored projection in the rearward portion of the reaction space that falls substantially between shadows of the rearward ribs, and a majority of the shadows formed by the rearward ribs have a mirrored projection in the forward portion of the reaction space that falls substantially between shadows of the forward ribs.

12. The reaction chamber of claim 11, wherein the number of said ribs provided on the outer surface of the chamber upper wall is equal to the number of said ribs provided on the outer surface of the chamber lower wall.

13. The reaction chamber of claim 12, wherein each of said ribs on the chamber upper wall is aligned with one of said ribs on the chamber lower wall.

14. The reaction chamber of claim 11, wherein said majority of the shadows of said forward and rearward ribs comprises all but the closest of said ribs to said central axis.

15. The reaction chamber of claim 11, wherein each of said mirrored projections overlaps both of the adjacent shadows of opposing ribs.

16. The reaction chamber of claim 11, wherein each of said mirrored projections is approximately equidistant from adjacent shadows.

17. The reaction chamber of claim 16, wherein approximately equidistant comprises a mirrored projection being no more than about 15% of the distance between two opposing ribs from the midpoint between the two opposing ribs.

18. The reaction chamber of claim 16, wherein approximately equidistant comprises a mirrored projection being no more than about 10% of the distance between two opposing ribs from the midpoint between the two opposing ribs.

19. The reaction chamber of claim 16, wherein approximately equidistant comprises a mirrored projection being no more than about 5% of the distance between two opposing ribs from the midpoint between the two opposing ribs.

20. A reaction chamber, comprising:
a chamber upper wall and a chamber lower wall, each wall having an inner surface and an outer surface and defining a reaction space therebetween;
a substrate support provided within said reaction space, said substrate support having a central axis around which said substrate support rotates;
a plurality of forward ribs provided on the outer surface of at least one of the chamber upper wall and chamber lower wall that project a shadow in a portion upstream of the central axis of the reaction space; and
a plurality of rearward ribs provided on the outer surface of at least one of the chamber upper wall and chamber lower wall that project a shadow in a portion downstream of the central axis of the reaction space;
wherein at least some of the shadows of the forward ribs have a mirrored projection in the downstream portion of the reaction space that are approximately equidistant from adjacent rearward ribs, and at least some of the shadows of the rearward ribs have a mirrored projection in the upstream portion of the reaction space that are approximately equidistant from the adjacent forward ribs.

21. The reaction chamber of claim 20, further comprising an inlet flange secured at a forward end of said chamber to said chamber upper wall and said chamber lower wall, an outlet flange secured at a rearward end of said chamber to said chamber upper wall and said chamber lower wall, a heat source provided above said chamber, and a heat source provided below said chamber.

22. The reaction chamber of claim 20, wherein said plurality of forward ribs is provided on said chamber upper wall and said chamber lower wall, and said plurality of rearward ribs is provided on said chamber upper wall and said chamber lower wall.

23. The reaction chamber of claim 20, wherein approximately equidistant comprises a mirrored projection being no more than about 15% of the distance between two opposing ribs from the midpoint between the two opposing ribs.

24. The reaction chamber of claim 20, wherein approximately equidistant comprises a mirrored projection being no more than about 10% of the distance between two opposing ribs from the midpoint between the two opposing ribs.

25. The reaction chamber of claim 20, wherein approximately equidistant comprises a mirrored projection being no more than about 5% of the distance between two opposing ribs from the midpoint between the two opposing ribs.

26. The reaction chamber of claim 20, wherein the number of said ribs provided on the outer surface of the chamber upper wall is equal to the number of said ribs provided on the outer surface of the chamber lower wall.

27. The reaction chamber of claim 26, wherein each of said ribs on the chamber upper wall is aligned with one of said ribs on the chamber lower wall.

* * * * *